United States Patent [19]

Seto

[11] Patent Number: 5,121,024

[45] Date of Patent: Jun. 9, 1992

[54] PIEZOELECTRIC DEVICE OPERABLE IN THE THICKNESS SHEAR VIBRATORY MODE AND MANUFACTURING METHOD THEREFOR

[75] Inventor: Hiroshi Seto, Kyoto, Japan

[73] Assignee: Murata Manufacturing Co., Ltd., Japan

[21] Appl. No.: 529,893

[22] Filed: May 25, 1990

[30] Foreign Application Priority Data

May 27, 1989 [JP] Japan .................. 1-134224

[51] Int. Cl.⁵ .......................... H01L 41/08
[52] U.S. Cl. .................. 310/320; 310/340; 310/345; 310/358; 310/359; 29/25.35
[58] Field of Search ........... 29/25.35; 310/320, 340, 310/345, 358, 359

[56] References Cited

U.S. PATENT DOCUMENTS

| 3,593,219 | 7/1971 | Tsuchiya | 333/192 |
|---|---|---|---|
| 3,650,003 | 3/1972 | Toyoshima | 29/25.35 |
| 3,747,176 | 7/1973 | Toyoshima | 310/340 |
| 3,859,546 | 1/1975 | Doi et al. | 310/359 |
| 4,365,181 | 12/1982 | Yamamoto | 310/320 |
| 4,418,299 | 11/1983 | Momosoki | 310/361 |
| 4,714,848 | 12/1987 | Chen | 310/358 |
| 4,920,296 | 4/1990 | Takahashi et al. | 310/320 |

FOREIGN PATENT DOCUMENTS

| 0133351 | 11/1978 | Japan | 29/25.35 |
|---|---|---|---|
| 0003201 | 1/1980 | Japan | 29/25.35 |
| 0013581 | 1/1980 | Japan | 29/25.35 |
| 0050722 | 4/1980 | Japan | 310/340 |
| 0002721 | 1/1981 | Japan | 29/25.35 |
| 0042415 | 4/1981 | Japan | 29/25.35 |
| 0062613 | 4/1982 | Japan | 29/25.35 |
| 0134618 | 7/1985 | Japan | 310/358 |
| 0053985 | 3/1988 | Japan | 310/358 |
| 1135414 | 12/1968 | United Kingdom | |

OTHER PUBLICATIONS

U.S. patent application Ser. No. 07/376,598, Jul. 7, 1989, H. Takahashi.
European Search Report.

Primary Examiner—Mark O. Budd
Assistant Examiner—Thomas M. Dougherty
Attorney, Agent, or Firm—Ostrolenk, Faber, Gerb & Soffen

[57] ABSTRACT

A piezoelectric device operable in the thickness shear vibratory mode, and a method for manufacturing the piezoelectric device. In the piezoelectric device, a rectangular piezoelectric plate is polarized to have its polarization axis inclined to both the long and short sides thereof. This is accomplished by applying a predetermined electric field to the piezoelectric plate in the direction of the long side thereof, after applying a predetermined electirc field to it in the direction of the short side thereof. A pair of electrodes are formed on the piezoelectric plate so that the piezoelectric device is operable in the thickness shear vibration mode.

8 Claims, 6 Drawing Sheets

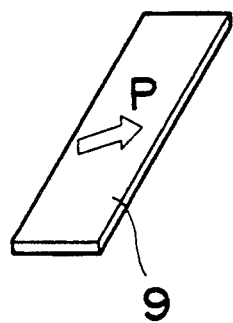
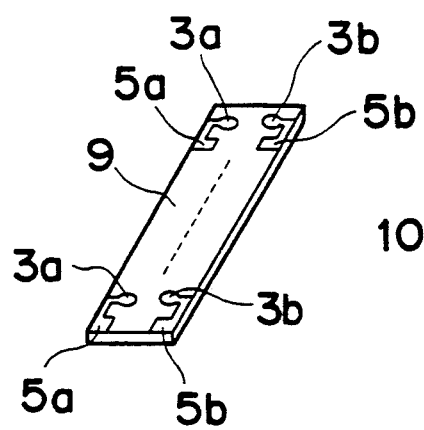
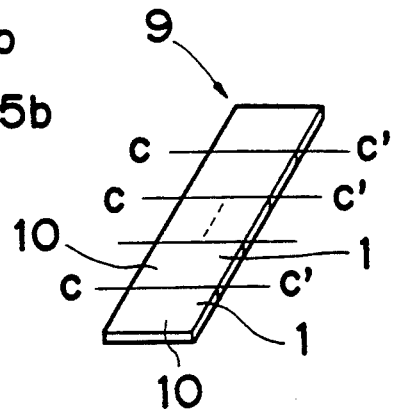
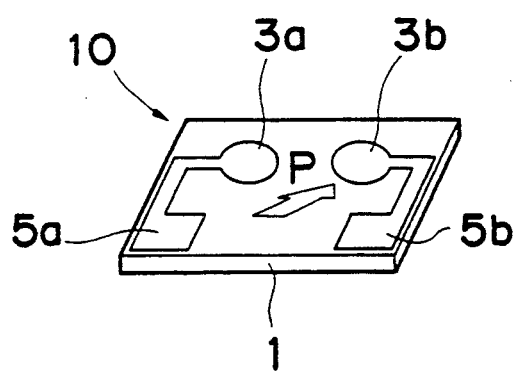
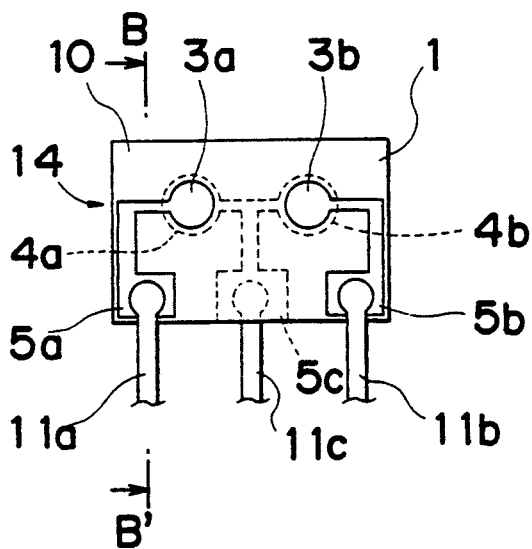
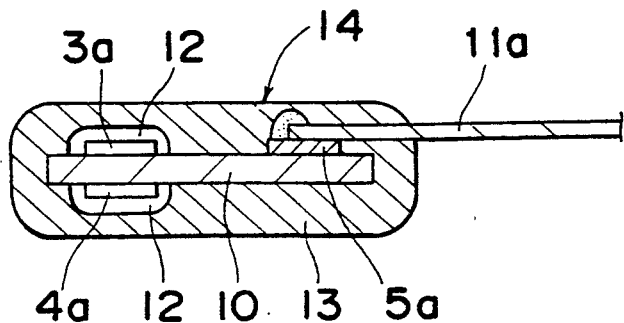

PIEZOELECTRIC DEVICE OPERABLE IN THE THICKNESS SHEAR VIBRATORY MODE AND MANUFACTURING METHOD THEREFOR

BACKGROUND OF THE INVENTION

1. Field of the Invention

The present invention relates to a piezoelectric device which is operable in the thickness shear vibratory mode and a manufacturing method therefor, more particularly, to a piezoelectric device such as an energy-trapped-type piezoelectric device, a piezoelectric filter or, a piezoelectric discriminator, and a manufacturing method therefor.

2. Description of Related Art

A conventional piezoelectric device which is operable in the thickness shear vibratory mode has been manufactured as shown in FIGS. 1a to 1j. The manufacturing method therefor will be described below with reference to FIGS. 1a to 1j.

First of all, a pair of electrodes 27 of Cu for a polarization process are formed on both of the top and bottom surfaces of a piezoelectric mother plate 2 having a shape a rectangular parallelepiped shown in FIG. 1a, and then, a predetermined direct-current voltage is applied between the pair of electrodes 27 so as to polarize the piezoelectric mother plate 2 in a direction of the thickness thereof as shown in FIG. 1b. Thereafter, the pair of electrodes 27 are removed from the piezoelectric mother plate 2 as shown in FIG. 1c, and then, the piezoelectric mother plate 2 is sliced so as to make plural sliced plates 9, as shown in FIGS. 1d and 1e.

Thereafter, plural pairs of circular electrodes 3a and 3b for a vibration and plural pairs of rectangular terminal electrodes 5a and 5b are formed on a top surface of the sliced plate 9 so that each pair of electrodes 3a and 3b are opposed to each other, each pair of electrodes 5a and 5b are opposed to each other, each electrode 3a is electrically connected to a corresponding electrode 5a, and each electrode 3b is electrically connected to a corresponding electrode 5b, as shown in FIG. 1f. Further, plural sets of circular electrodes 4a and 4b for the vibration and rectangular terminal electrode 5c are formed on a bottom surface of the sliced plate 9 so that the electrodes 4b and 4b respectively oppose to the electrodes 3a and 3b, the electrode 5c is located between the electrodes 5a and 5b, and each set of electrodes 4b, 4b and 5c are electrically connected to each other, as shown in FIG. 1i.

Thereafter, as shown in FIG. 1g, the sliced plate 9 is cut along lines c—c' so as to make plural piezoelectric vibration elements 30, each element 30 comprising a piezoelectric plate 1 of a rectangular shape having a long side and a short side, as shown in FIG. 1h. The direction of the polarization axis of each piezoelectric vibration element 30 as indicated by a polarization vector P is parallel to the long side of the piezoelectric plate 1. Thereafter, leads 11a, 11b and 11c are soldered on the electrodes 5a, 5b and 5c of the piezoelectric vibration element 30, respectively, as shown in FIG. 1i. Finally, the piezoelectric vibration element 30 is fully packaged with a resin outer package 13 of epoxy resin so as to make closed cavities 12 having a predetermined volume on the electrodes 3a, 3b, 4b and 4b and in the vicinity thereof, resulting in a conventional piezoelectric device, as shown in FIG. 1j.

In the conventional piezoelectric device manufactured as described above, the direction of the polarization axis of each piezoelectric vibration element 30 as indicated by the polarization vector P is parallel to the long side of the piezoelectric plate 1, as shown in FIG. 2. It is to be noted that no electrodes are drawn in FIG. 2. In FIG. 2, $l_a$ denotes a length in the direction of the short side of the piezoelectric plate 1, and $l_b$ denotes a length of in the direction of the long side thereof, wherein $l_a < l_b$.

However, in the conventional piezoelectric device packaged with the resin outer package 13 as described above, there may occur a thermal stress between the resin outer package 13 and the piezoelectric plate 1 because of the expansion or the contraction thereof due to a difference between the thermal expansion coefficients of the resin outer package 13 and the piezoelectric plate 1 and a change in the environmental temperature. If the thermal stress to be applied to the piezoelectric plate 1 changes, the resonance frequency of the piezoelectric device may change. Namely, the resonance frequency of the piezoelectric device may be shifted by a change in the temperature thereof.

FIG. 3 shows a deviation $\Delta f_0$ in the resonance frequency characteristic on the environmental temperature of the conventional piezoelectric device having the polarization direction parallel to the long side of the piezoelectric plate 1 as shown in FIG. 2, wherein the abscissa represents the environmental temperature, and the ordinate represents the deviation $\Delta f_0$ in the resonance frequency $f_0(T)$ thereof with a reference of a resonance frequency $f_0(20)$ in an environmental temperature of 20 °C., which is represented by the following equation (1).

$$\Delta f_0 = f_0(T) - f_0(20) \tag{1}$$

As is apparent from FIG. 3, the resonance H frequency $f_0$ of the conventional piezoelectric device changes depending on a change in the environmental temperature, and also, the conventional piezoelectric device has a negative temperature characteristic with respect to the resonance frequency $f_0$ thereof since the resonance frequency $f_0$ decreases as the environmental temperature increases.

Further, a piezoelectric device having the direction of the polarization axis parallel to the short side of the piezoelectric plate 1 can be made by the conventional manufacturing method, as shown in FIG. 4.

FIG. 5 shows a deviation $\Delta f_0$ in the resonance frequency characteristic depending on the environmental temperature of the conventional piezoelectric device having the polarization direction parallel to the short side of the piezoelectric plate 1 as shown in FIG. 4.

As is apparent from FIG. 5, the resonance frequency $f_0$ thereof is shifted depending on a change in the environmental temperature, however, the piezoelectric device shown in FIG. 4 has a positive temperature characteristic with respect to the resonance frequency $f_0$ thereof since the resonance frequency $f_0$ increases as the environmental temperature increases.

As described above, the problem exists that there is a relatively large change in the resonance frequency $f_0$ due to a change in the environmental temperature in the piezoelectric devices shown in FIGS. 2 and 4 which are made by the conventional manufacturing method. Further, since there is a relatively large change in the resonance frequency $f_0$ thereof due to the environmental temperature, it is necessary to measure the resonance frequency $f_0$ of a piezoelectric device keeping the environmental temperature constant, when checking whether or not each of the manufactured piezoelectric devices is an off-specification product, resulting in a relatively high cost for detecting off-specifications products.

SUMMARY OF THE INVENTION

An essential object of the present invention is to provide a piezoelectric device which is operable in the thickness shear vibratory mode, having an improved temperature characteristic of the resonance frequency.

Another object of the present invention is to provide a piezoelectric device which is operable in the thickness shear vibratory mode, having little or no change in the resonance frequency depending on the environmental temperature.

A further object of the present invention is to provide a method for manufacturing a piezoelectric device which is operable in the thickness extensional vibratory mode, having an improved temperature characteristic of the resonance frequency.

A still further object of the present invention is to provide a method for manufacturing a piezoelectric device which is operable in the thickness extensional vibratory mode, having the resonance frequency almost not changing depending on the environmental temperature.

In order to accomplish the above objects, according to one aspect of the present invention, there is provided a piezoelectric device comprising:

a rectangular piezoelectric plate being polarized in a direction of a polarization axis inclined to both of long and short sides thereof; and a pair of electrodes being formed on said piezoelectric plate so that said piezoelectric device is operable in the thickness extensional vibration mode.

According to another aspect of the present invention, said device further comprises a resin outer package for packaging said piezoelectric plate having said electrodes so as to form cavities on said electrodes and in the vicinity thereof.

According to a further aspect of the present invention, said device further comprises:

an elastic member for packaging said piezoelectric plate having said electrodes; and a resin outer package for further packaging said piezoelectric plate packaged with said elastic member.

According to a still further aspect of the present invention, there is provided a method for manufacturing a piezoelectric device operable in the thickness extensional vibratory mode, including the steps of:

polarizing a rectangular piezoelectric plate having a first side and a second side perpendicular to said first side in a direction of said first side thereof so that said piezoelectric plate has a polarization axis parallel to said first side thereof by applying a predetermined electric field to said piezoelectric plate in the direction of said first side thereof;

polarizing said piezoelectric plate in a direction of said second side thereof so that said piezoelectric plate has a polarization axis inclined to both of said first and second sides thereof by applying a predetermined electric field to said piezoelectric plate in the direction of said second side thereof; and forming a pair of electrodes on said piezoelectric plate so that said piezoelectric device is operable in the thickness extensional vibration mode.

According to a further aspect of the present invention, said method further includes a step of forming a resin outer package for packaging said piezoelectric plate having said electrodes so as to form cavities on said electrodes and in the vicinity thereof.

According to a still further aspect of the present invention, said method further includes steps of:

forming an elastic member for packaging said piezoelectric plate having said electrodes; and forming a resin outer package for further packaging said piezoelectric plate packaged with said elastic member.

BRIEF DESCRIPTION OF THE DRAWINGS

These and other objects and features of the present invention will become clear from the following description of preferred embodiments thereof with reference to the accompanying drawings, in which:

FIGS. 6a to 6h are perspective views showing a method for manufacturing a piezoelectric device, which is operable in the thickness shear vibratory mode, of a preferred embodiment according to the present invention;

FIG. 6i is a top plan view showing a process of the method for manufacturing the piezoelectric device of the preferred embodiment;

FIG. 6j is a cross sectional view taken on a line of B—B' of FIG. 6i showing the piezoelectric device packaged with a resin outer package;

DETAILED DESCRIPTION OF THE PREFERRED EMBODIMENTS

Preferred embodiments according to the present invention will be described below with reference to the attached drawings.

Figure 6A:
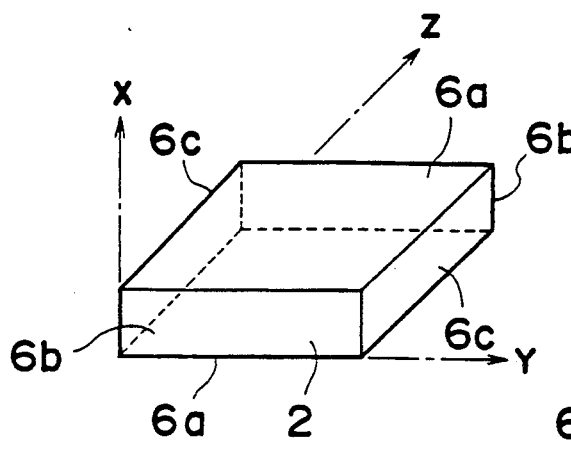

FIGS. 6a or 6j show a method for manufacturing an energy-trapped-type piezoelectric device, which is operable in the thickness shear vibratory mode, of a preferred embodiment according to the present invention.

As shown in FIG. 6a, a piezoelectric mother plate 2 node of a piezoelectric ceramics having a shape of rectangular parallelepiped has a pair of first surfaces or top and bottom surfaces 6a parallel to the YZ-plane which oppose each other, a pair of second surfaces 6b parallel the XY-plane which oppose to each other, and a pair of third surfaces 6c parallel to the XZ-plane which oppose each other.

Figure 6B:
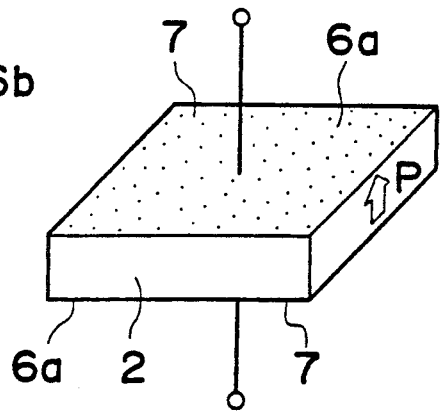

First of all, as shown in FIG. 6b, a pair of electrodes 7 of Cu for a first polarization process are formed on both of the first surfaces 6a of the piezoelectric mother plate 2, and then, a predetermined direct-current voltage is applied to the piezoelectric mother plate 2 between the pair of electrodes 7 so as to polarize the piezoelectric mother plate 2 in a direction of the thickness thereof or the X-axis perpendicular to the first surfaces 6a, as indicated by a polarization vector P shown in FIG. 6b.

After completing the first polarization process, the pair of electrodes 7 are removed from the first surfaces 6a of the piezoelectric mother plate 2. Then, a pair of electrodes 8 of Cu for a second polarization process are formed on both of the second surfaces 6b of the piezoelectric mother plate 2, and then, a predetermined direct-current voltage is applied to the piezoelectric mother plate 2 between the pair of electrodes 8 so as to polarize the piezoelectric mother plate 2 in a direction of the Z-axis perpendicular to the second surfaces 6b. By this process, the polarization vector P is rotated in the XZ-plane parallel to the third surfaces 6c so as to be inclined to the X-axis.

In other words, when the predetermined direct-current voltage is applied to the piezoelectric mother plate 2 in the second polarization process, a composition electric field of the internal electric field, formed of the piezoelectric mother plate 2 directed in the X-axis direction (FIG. 6b) and the external electric field induced by the applied voltage of the second polarization process, is directed in a direction which is inclined to both the X-axis and the Z-axis, so that the direction of the polarization axis of the piezoelectric mother plate 2 is rotated toward the Z-axis by a rotation angle which is larger than zero and is smaller than 90 degrees. Therefore, the direction of the polarization vector P obtained after the second polarization process is determined depending on the applied voltage of the first polarization process and the applied voltage of the second polarization process.

If the applied voltage of the second polarization process is sufficiently smaller than that of the first polarization process, the direction of the resultant polarization vector is nearly parallel to the X-axis direction. However, if the applied voltage of the second polarization process is sufficiently larger than that of the first polarization process, the direction of the resultant polarization vector becomes nearly parallel to the Z axis direction.

Figure 6C:
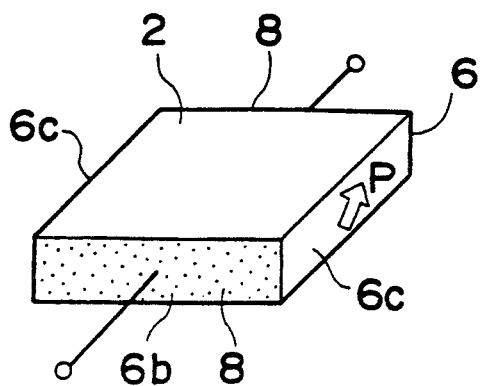
Figure 6D:
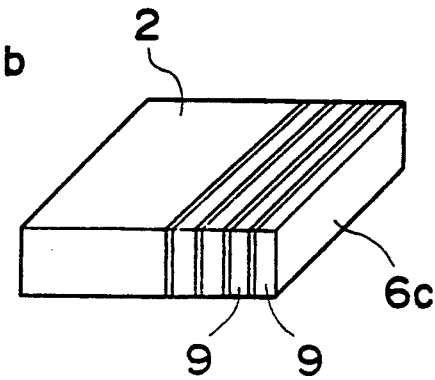
Figure 7:
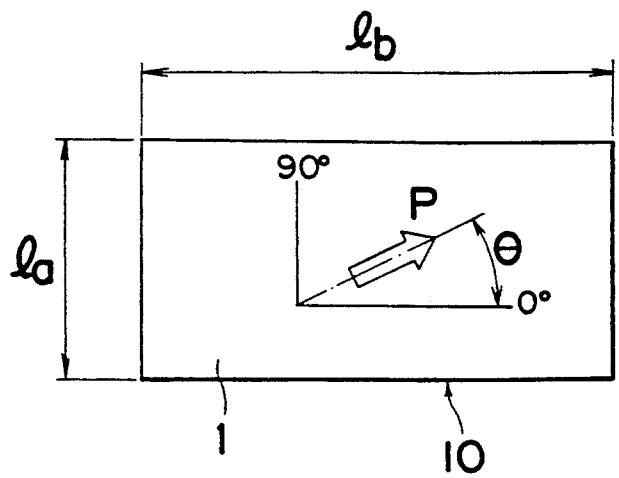
FIG. 7 is a top plan view showing the piezoelectric device manufactured by the manufacturing method shown in FIGS. 6a to 6j of the preferred embodiment, which has a polarization vector inclined to both a long side and a short side of a piezoelectric plate thereof.

After completing the second polarization process, the pair of electrodes 8 is removed from the second surfaces 6b of the piezoelectric mother plate 2, and then, the piezoelectric mother plate 2 is sliced so as to make plural sliced plates 9 in a direction parallel to the XZ-plane, as shown in FIG. 6d. The direction of the thickness of the sliced plate 9 is parallel to the Y-axis direction perpendicular to the XZ-plane, the polarization vector P thus being inclined to the directions of both the long and short sides of the sliced plate 9 as shown in FIG. 6e.

Thereafter, plural pairs of circular electrodes 3a and 3b for operating a vibration and corresponding plural pairs of rectangular terminal electrodes 5a and 5b are formed on a top surface of the sliced plate 9 so that each pair of electrodes 3a and 3b opposes each other, each pair of electrodes 5a and 5b opposes each other, each electrode 3a is electrically connected to a corresponding electrode 5a, and each electrode 3b is electrically connected to a corresponding electrode 5b, as shown in FIG. 6f. Further, plural sets of circular common electrodes 4a a 4b and rectangular terminal electrode 5c are formed on a bottom surface of the sliced plate 9 so that the electrodes 4a and 4b respectively oppose the electrodes 3a and 3b, the electrode 5c is located between the electrodes 5a and 5b, and each set of electrodes 4a, 4b and 5c is electrically connected to each other, as shown in FIG. 6i.

Thereafter, as shown in FIG. 6g, the sliced plate 9 is cut along lines c—c' parallel to the X-axis direction so as to make plural piezoelectric vibration elements 10, each element 10 comprising a piezoelectric plate 1 of a rectangular shape having a long side and a short side, as shown in FIG. 6h. Thus, there is obtained the piezoelectric vibration element 10 having a pair of electrodes 3a and 3b for the vibration, the common electrodes 4a and 4b and the terminal electrodes 5a, 5b and 5c, which are formed on the top or bottom surface of the piezoelectric plate 1 having a shape of rectangular strip, and the direction of the polarization vector P of the piezoelectric plate 1 is inclined to the directions of both of the long and short sides of the piezoelectric plate 1, as shown in FIG. 6h.

Thereafter, leads 11a, 11b and 11c are soldered on the terminal electrodes 5a, 5b and 5c of the piezoelectric vibration element 10, respectively, as shown in FIG. 6i. Finally, the piezoelectric vibration element 10 is fully packaged with a resin outer package 13 of epoxy resin so as to make closed cavities 12 having a predetermined volume on the electrodes 3a, 3b, 4a and 4b and in the vicinity thereof, resulting in a piezoelectric device or an energy-trapped-type piezoelectric device 14 as shown in FIG. 6j.

In the piezoelectric device of the preferred embodiment according to the present invention which is manufactured as described above, the direction of the polarization axis of each piezoelectric vibration element 10 as indicated by the polarization vector P is inclined from the direction of the long side of the piezoelectric plate 1 by a predetermined inclination angle $\theta$ which is larger than zero and smaller than 90 degrees. The inclination angle $\theta$ can be controlled by adjusting a ratio of the applied voltage of the first polarization process to that of the second polarization process.

Figures 1A, 1B:
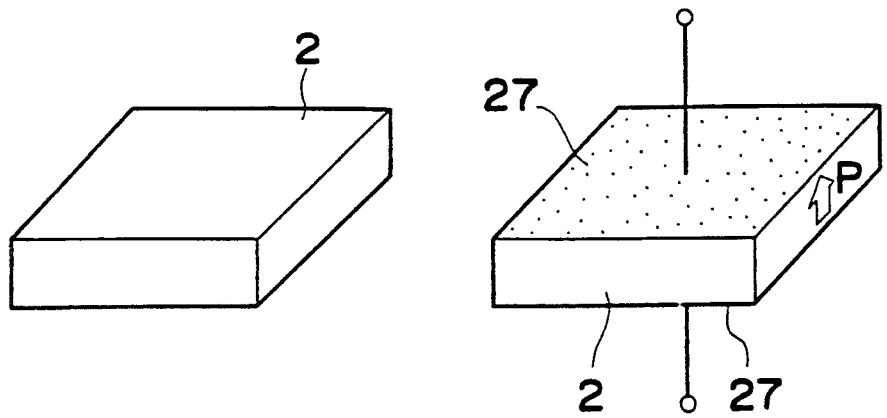
FIGS. 1a to 1h are perspective views showing a method for manufacturing a conventional piezoelectric device which is operable in the thickness shear vibratory mode.
Figures 1C, 1D:
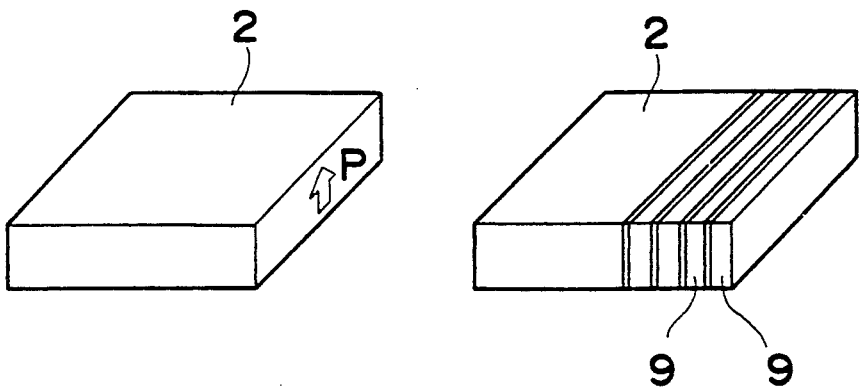
Figures 1E, 1F, 1G:
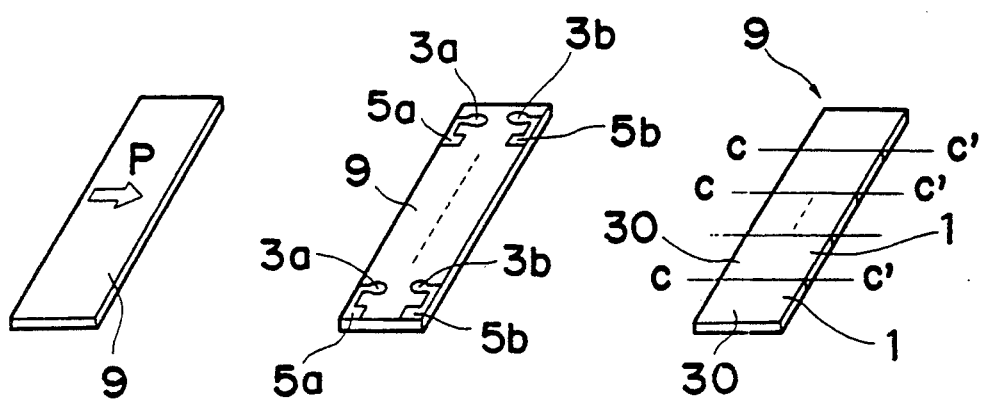
Figure 1H:
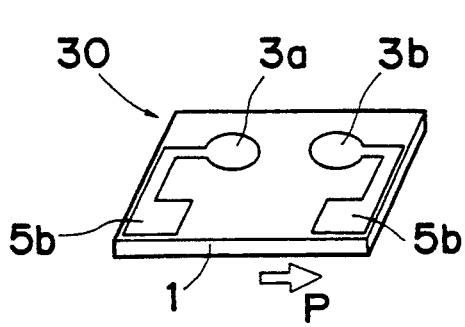
Figure 1I:
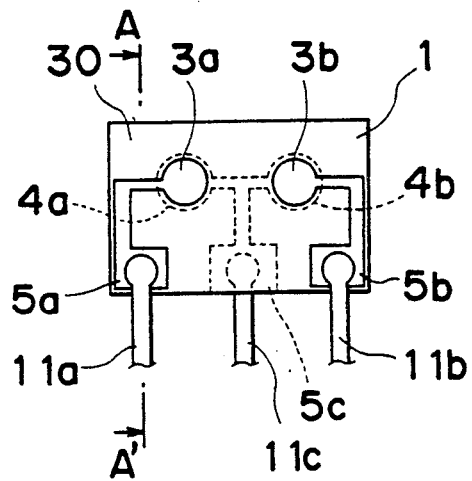
FIG. 1i is a top plan view showing a process of the method for manufacturing the conventional piezoelectric device.
Figure 1J:
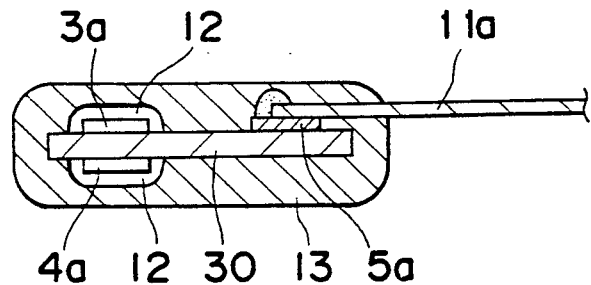
FIG. 1j is a cross sectional view taken on a line of A-A' of FIG. 1i showing the piezoelectric device packaged with a resin outer package.
Figure 2:
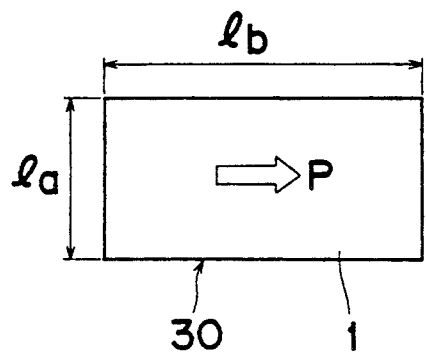
FIG. 2 is a top plan view showing the piezoelectric device manufactured by the conventional manufacturing method shown in FIGS. 1a to 1j, which has a polarization vector parallel to a long side of a piezoelectric plate thereof.
Figure 3:
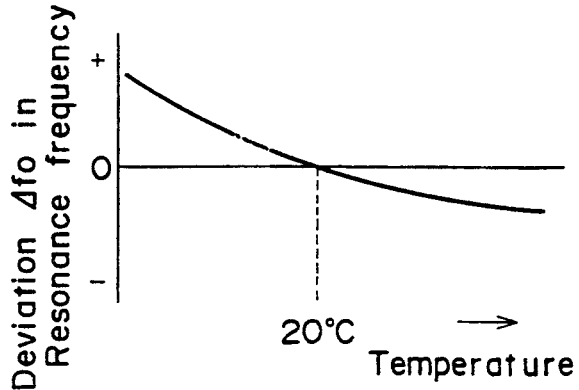
FIG. 3 is a graph showing a deviation in a resonance frequency characteristic of the piezoelectric device shown in FIG. 2 depending on an environmental temperature.
Figure 4:
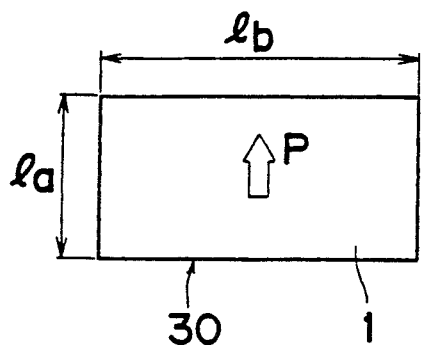
FIG. 4 is a top plan view showing another piezoelectric device manufactured by another conventional manufacturing method, which has a polarization vector parallel to a short side of a piezoelectric plate thereof.
Figure 5:
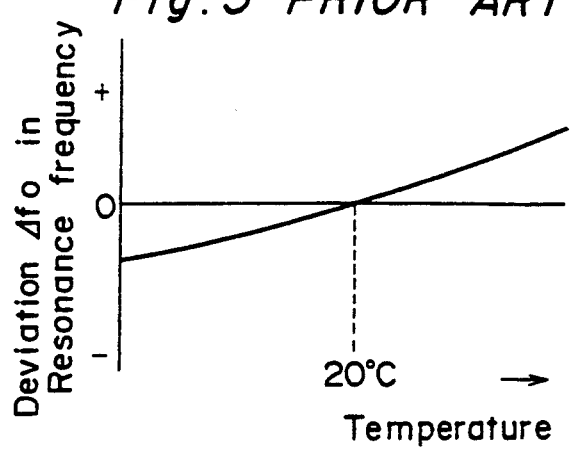
FIG. 5 is a graph showing a deviation in a resonance frequency characteristic of the piezoelectric device shown in FIG. 4 depending on an environmental temperature.

For example, if the applied voltage of the second polarization process is set at zero, the inclination angle $\theta$ becomes zero. Further, as the applied voltage of the second polarization process is increased, the inclination angle $\theta$ increases gradually, and reaches 90 degrees. In the case of an inclination angle $\theta$ of zero, the piezoelectric vibration element 10 has a negative temperature characteristic of the resonance frequency shown in FIG. 3. On the other hand, in the case of an inclination angle $\theta$ of 90 degrees, the piezoelectric vibration element 10 has a positive temperature characteristic of the resonance frequency shown in FIG. 5. Therefore, a piezoelectric device having any temperature characteristic of the resonance frequency can be obtained by controlling the inclination angle $\theta$ or the direction of the polarization axis of the piezoelectric plate 1. For example, if the absolute value of the deviation $\Delta f_0$ in the resonance frequency due to a change in the environmental temperature becomes equal to or smaller than 50 ppm/°C., there can be obtained a piezoelectric device having a stable or nearly constant temperature characteristic of the resonance frequency.

Next, a result of an experiment upon an energy-trapped-type piezoelectric device of the preferred embodiment according to the present invention, which was performed by the present inventors, will be described below.

In the experiment, two piezoelectric rectangular plates of piezoelectric ceramics having a dimension of $20 \times 30 \times 9$ (mms) were prepared. First of all, the first polarization process was performed for both of the piezoelectric plates so as to polarize them in the X-axis direction or the direction of the thickness thereof, wherein the applied voltage thereof which was estimated in the intensity of the electric field applied thereto was 2.0 kV/mm. Thereafter, the second polarization process was performed for both of the piezoelectric plates by respectively applying different direct-current voltages to them in the Z-axis direction, wherein the applied voltage for a first piezoelectric plate which was estimated in the intensity of the electric field was 0.7 kV/mm, and the applied voltage for a second piezoelectric plate which was estimated similarly was 1.5 kV/mm.

Thereafter, the manufacturing processes shown in FIGS. 6d to 6j were performed for both of the first and second piezoelectric plates, resulting in first and second energy-trapped-type piezoelectric devices.

The present inventors measured the temperature characteristic of the resonance frequency $f_0$ of both of the obtained first and second energy-trapped-type piezoelectric devices.

In the first device which was obtained by applying an intensity of electric field of 0.7 kV/mm to the piezoelectric plate 1 in the second polarization process, the ratio $\Delta f_0 / \Delta T$ of the deviation $\Delta f_0$ in the resonance frequency to a predetermined change $\Delta T$ in the environmental temperature fell in the range from $-15$ ppm/°C. to $+5$ ppm/°C.

On the other hand, in the second device which was obtained by applying an intensity of electric field of 1.5 kV/mm to the piezoelectric plate 1 in the second polarization process, the ratio $\Delta f_0 / \Delta T$ of the deviation $\Delta f_0$ in the resonance frequency to a predetermined change $\Delta T$ in the environmental temperature fell in the range from $+10$ ppm/°C. to $+20$ ppm/°C.

Further, in the conventional device having the polarization direction parallel to the direction of the long side of the piezoelectric plate or having an inclination angle $\theta$ of the polarization axis of zero which was obtained by performing only one polarization process, the ratio $\Delta f_0 / \Delta T$ of the deviation $\Delta f_0$ in the resonance frequency to a predetermined change $\Delta T$ in the environmental temperature fell in the range from $-50$ ppm/°C. to $-60$ ppm/°C. On the other hand, in another conventional device having the polarization direction parallel to the direction of the short side of the piezoelectric plate or having an inclination angle $\theta$ of the polarization axis of 90 degrees which was obtained by performing only one polarization process, the ratio $\Delta f_0 / \Delta T$ of the deviation $\Delta f_0$ in the resonance frequency to a predetermined change $\Delta T$ in the environmental temperature was fallen in the range from $+20$ ppm/°C. to $+30$ ppm/°C.

Figure 8:
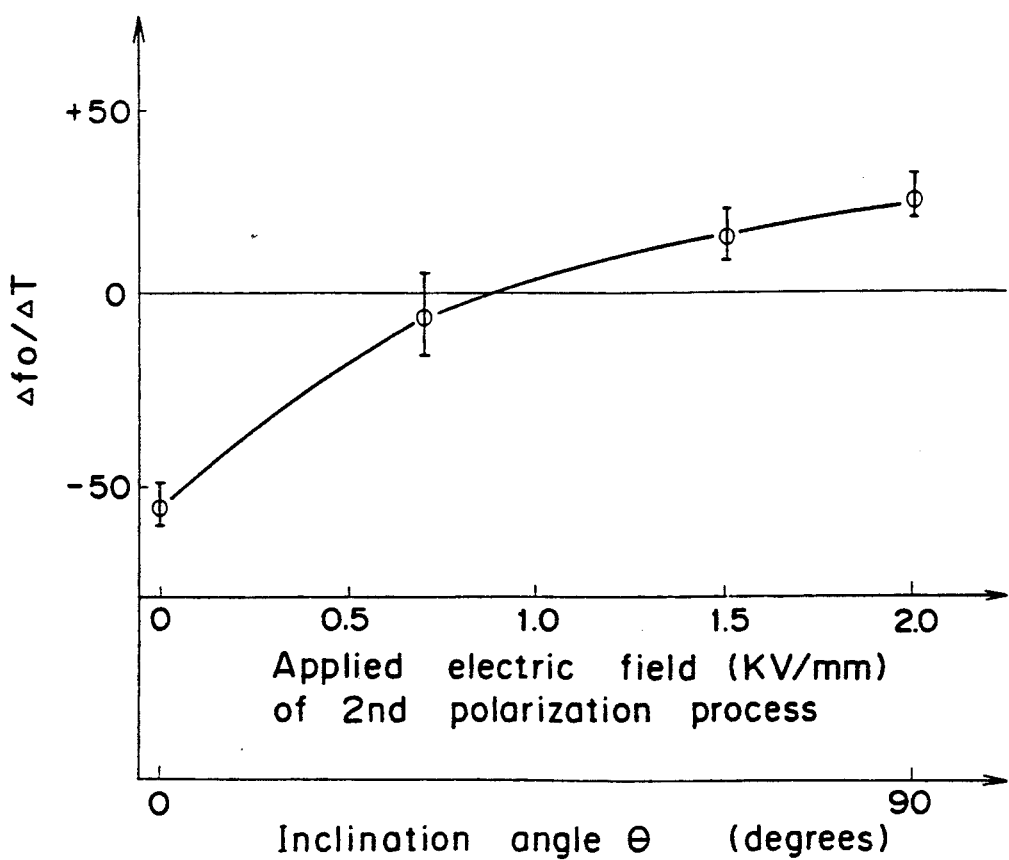
FIG. 8 is a graph showing a characteristic of a ratio of a deviation in the resonance frequency of the piezoelectric device of the preferred embodiment to a predetermined change in the environmental temperature depending on an inclination angle at which the polarization axis crosses the direction of the long side of the piezoelectric plate thereof.

FIG. 8 shows the above ratio $\Delta f / \Delta T$ characteristic as a function of the applied electric field (kV/mm) of the second polarization process or the aforementioned inclination angle $\theta$ (degrees).

As is apparent from FIG. 8, as the inclination angle $\theta$ increases from zero to 90 degrees, the above ratio $\Delta f_0 / \Delta T$ increases from a negative value to a positive value.

Therefore, according the manufacturing method of the preferred embodiment according to the present invention, the absolute value of the above ratio $\Delta f_0 / \Delta T$ can be decreased, and the temperature characteristic of the piezoelectric device can be improved so as to decrease the change in the resonance frequency thereof depending on the environmental temperature. Further, since the temperature characteristic thereof has the range from a negative characteristic to a positive characteristic, the temperature characteristic can be set $\Delta f_0 / \Delta T \approx 0$ ppm/°C. by suitably selecting the direction of the polarization axis, as shown in FIG. 8.

Figure 9:
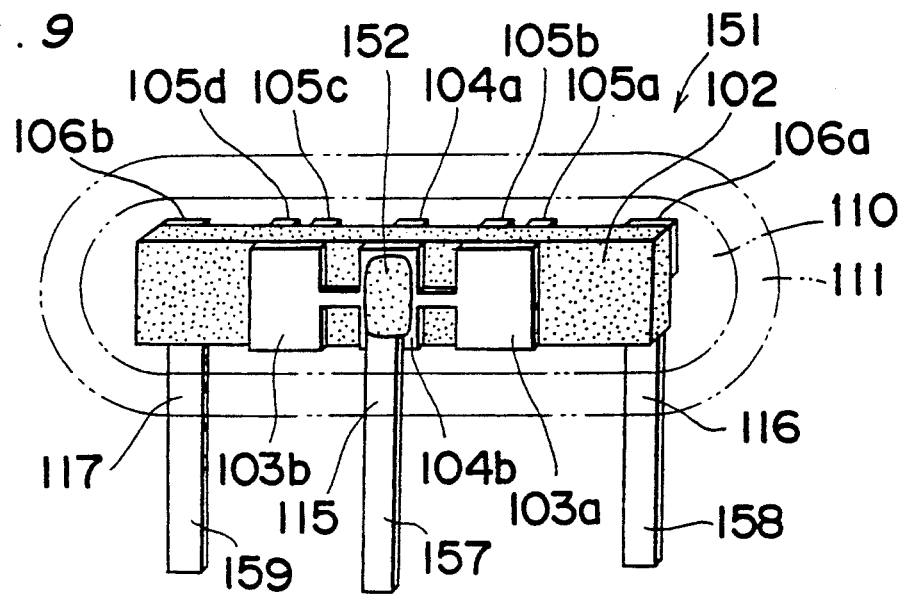
FIG. 9 is a perspective view showing a piezoelectric device of another preferred embodiment according to the present invention.
Figure 10:
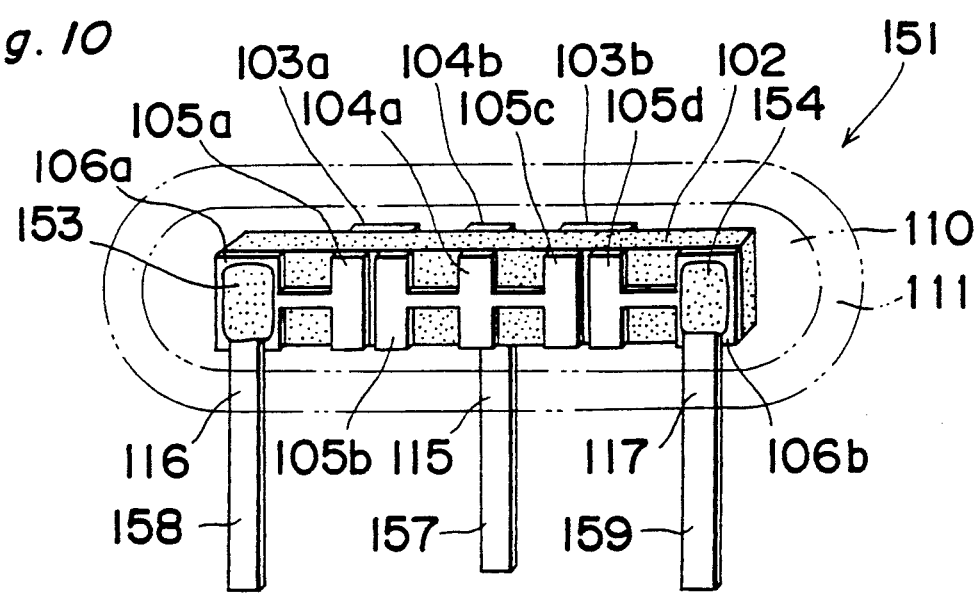
FIG. 10 is a perspective view seen from the side of the rear surface of the piezoelectric device shown in FIG. 9.

FIGS. 9 and 10 show a piezoelectric device 151 of another preferred embodiment according to the present invention, wherein FIG. 9 is a perspective view seen from the side of the front surface thereof, and FIG. 10 is a perspective view seen from the side of the rear surface thereof.

Figure 11:
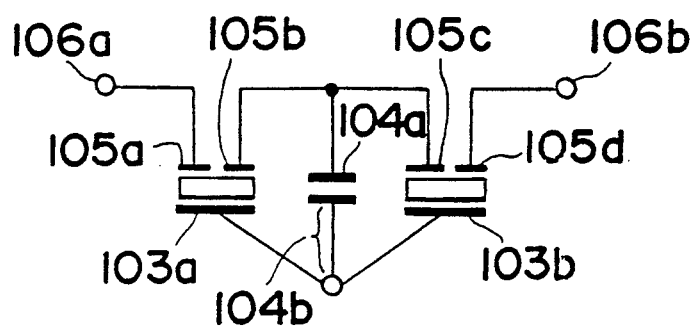
FIG. 11 is a circuit diagram showing an equivalent circuit of the piezoelectric device shown in FIGS. 9 and 10.

On a piezoelectric vibration element 102 of the piezoelectric device 151, there are formed a three terminal type first filter utilizing a thickness shear vibratory mode of vibration energy trapping type and a three terminal type second filter having a composition similar to that of the first filter which are connected in series to each other, and a capacitor which is electrically connected in parallel between the first and second filters, composed as shown in the equivalent circuit diagram of FIG. 11. It is to be noted that the piezoelectric vibration element 102 is made of a piezoelectric plate having a polarization axis which is inclined to both the long and short sides thereof similarly to that of the previous preferred embodiment.

On the front surface of the piezoelectric vibration element 102, there are formed a vibration electrode 103b, a terminal electrode 104b and a vibration electrode 103a which have a shape of a strip so as to be electrically connected to each other. On the other hand, on the rear surface of the piezoelectric vibration element 102, there are formed a terminal electrode 106a and a vibration electrode 105a which are electrically connected to each other; a vibration electrode 105b, a capacitor electrode 104b and a vibration electrode 105c which are electrically connected to each other; and a vibration electrode 105d and a terminal electrode 106b which are electrically connected to each other. The vibration electrodes 105a and 105b oppose to the vibration electrode 103a through the piezoelectric vibration element 102, the capacitor electrode 104a opposes the terminal electrode 104b, and the vibration electrodes 105c and 105d oppose the vibration electrode 103b.

Further, an input lead 158 is soldered with solder 153 on the terminal electrode 106a, an output lead 159 is soldered with solder 154 on the terminal electrode 159, and a ground lead 157 is soldered with solder 152 on the terminal electrode 104b.

Furthermore, in order to suppress unnecessary vibration, the piezoelectric vibration element 102 is fully covered with an elastic member 110 of silicon rubber, and further, is fully packaged with a resin outer package 111 of epoxy resin. It is to be noted that there is formed no cavity in the elastic member 110 and the resin outer package 111.

In the piezoelectric device shown in FIGS. 9 and 10, the leads 157, 158 and 159 are fixed by the elastic member 110 and the resin outer package 111. Since the elastic member 110 is easily deformed responsive to an external force to be applied thereto, the leads 157, 158 and 159 are fixed by portions 115 to 117 of the resin outer package 111, practically. The piezoelectric device of this type can overcome the problem described in the paragraph of the related art of the invention in a manner similar to that of the previous preferred embodiment.

According to the piezoelectric device of the preferred embodiment of the present invention, the direction of the polarization axis is inclined to both of the directions of the long and short sides of the piezoelectric plate 1. Therefore, the temperature characteristic of the resonance frequency can be improved so as to obtain a nearly constant temperature characteristic by adjusting the direction of the polarization axis. Further, since the resonance frequency is almost kept constant stably depending on a change in the environmental temperature, it is unnecessary to require a strictly controlled environmental temperature when the manufactured piezoelectric devices are checked to detect off-specification product. Therefore, the cost of detecting off-specification products can be decreased, and the yield of the manufactured products can be improved.

Further, according to a method for manufacturing the piezoelectric device of the preferred embodiment of the present invention, the direction of the polarization axis can be easily inclined to both of the directions of the long and short sides of the piezoelectric plate, and the direction of the polarization axis can be easily controlled by adjusting the ratio of the applied voltages of the first to second polarization processes.

The present invention is not limited to the present preferred embodiments. The order of performing the two polarization processes is not limited to performing the process shown in FIG. 6c. Rather, the process after performing the process shown in FIG. 6b, as described in the present preferred embodiment. The processes shown in FIG. 6b may be performed after performing the process shown in FIG. 6c. Also, a polarization process may be performed for the piezoelectric mother plate 2 three times or more.

Further, the method for cutting the polarized piezoelectric mother plate 2 so as to obtain plural piezoelectric plate 1 is not limited to that described in the present preferred embodiment.

Furthermore, a polarization process may be performed for the piezoelectric plate 1 (not mother plate) twice or more.

It is understood that various other modifications will be apparent to and can be readily made by those skilled in the art without departing from the scope and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. An energy-trapped-type piezoelectric device comprising:
   a rectangular piezoelectric plate which is polarized in a direction of a polarization axis inclined to both long and short sides of said plate;
   a plurality of pairs of electrodes which are formed on said piezoelectric plates so that said piezoelectric device is operable in the thickness shear vibration mode; and
   a resin outer package for packaging said piezoelectric plate having said electrodes so as to form cavities adjacent to said electrodes;
   wherein said plate has a pair of opposite major surfaces which are defined by said long and short sides, and wherein said pairs of electrodes are opposed to each other and disposed respectively on said opposite major surfaces.

2. A piezoelectric device as in claim 1, wherein an axis of vibration at one of said pairs of electrodes is directed so as to avoid interference with an axis of vibration at an adjacent pair of electrodes.

3. An energy-trapped-type piezoelectric device comprising:
   a rectangular piezoelectric plate which is polarized in a direction of a polarization axis inclined to both long and short sides of said plate;
   a plurality of pairs of electrodes which are formed on said piezoelectric plate so that said piezoelectric device is operable in the thickness shear vibration mode;
   an elastic member for packaging said piezoelectric plate having said electrodes; and
   a resin outer package for further packaging said piezoelectric plate packaged with said elastic member;
   wherein said plate has a pair of opposite major surfaces which are defined by said long and short sides, and wherein said pairs of electrodes are opposed to each other and disposed respectively on said opposite major surfaces.

4. A piezoelectric device as in claim 3, wherein an axis of vibration at one of said pairs of electrodes is directed so as to avoid interference with an axis of vibration at an adjacent pair of electrodes.

5. A method for manufacturing an energy-trapped-type piezoelectric device operable in the thickness shear vibration mode, including the steps of:
   polarizing a rectangular piezoelectric plate, having a first side and a second side perpendicular to said first side, in a direction of said first side thereof, so that said piezoelectric plate has a polarization axis parallel to said first side thereof, by applying a predetermined electric field to said piezoelectric plate in the direction of said first side thereof;

polarizing said piezoelectric plate in a direction of said second side thereof, so that said piezoelectric plate has a resultant polarization axis inclined to both of said first and second sides thereof, by applying a predetermined electric field to said piezoelectric plate in the direction of said second side thereof;

forming a plurality of pairs of electrodes on said piezoelectric plate so that said piezoelectric device is operable in the thickness shear vibration mode; and forming a resin outer package for packaging said piezoelectric plate having said electrodes so as to form cavities adjacent to said electrodes;

wherein said plate has a pair of opposite major surfaces which are defined by said first and second sides, and wherein said pairs of electrodes are opposed to each other and disposed respectively on said opposite major surfaces.

6. A piezoelectric device as in claim 5, wherein an axis of vibration at one of said pairs of electrodes is directed so as to avoid interference with an axis of vibration at an adjacent pair of electrodes.

7. A method for manufacturing an energy-trapped-type piezoelectric device operable in the thickness shear vibration mode, including the steps of:

polarizing a rectangular piezoelectric plate, having a first side and a second side perpendicular to said first side, in a direction of said first side thereof, so that said piezoelectric plate has a polarization axis parallel to said first side thereof, by applying a predetermined electric field to said piezoelectric plate in the direction of said first side thereof;

polarizing said piezoelectric plate in a direction of said second side thereof so that said piezoelectric plate has a polarization axis inclined to both of said first and second sides thereof, by applying a predetermined electric field to said piezoelectric plate in the direction of said second side thereof;

forming a plurality of pairs of electrodes on said piezoelectric plate so that said piezoelectric device is operable in the thickness shear vibration mode;

forming an elastic member for packaging said piezoelectric plate having said electrodes; and forming a resin outer package for further packaging said piezoelectric plate packaged with said elastic member;

wherein said plate has a pair of opposite major surfaces which are defined by said first and second sides, and wherein said pairs of electrodes are opposed to each other and disposed respectively on said opposite major surfaces.

8. A piezoelectric device as in claim 7, wherein an axis of vibration at one of said pairs of electrodes is directed so as to avoid interference with an axis of vibration at an adjacent pair of electrodes.

* * * * *